(12) United States Patent
Ding et al.

(10) Patent No.: US 8,367,537 B2
(45) Date of Patent: Feb. 5, 2013

(54) FLASH MEMORY CELL WITH A FLAIR GATE

(75) Inventors: Meng Ding, San Jose, CA (US);
YouSeok Suh, Cupertino, CA (US);
Shenqing Fang, Fremont, CA (US);
Kuo-Tung Chang, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 550 days.

(21) Appl. No.: 11/801,823

(22) Filed: May 10, 2007

(65) Prior Publication Data

US 2008/0277712 A1 Nov. 13, 2008

(51) Int. Cl.
*H01L 21/283* (2006.01)
(52) U.S. Cl. .................. 438/593; 257/E21.679
(58) Field of Classification Search .................. 257/315, 257/324, E29.3, E29.309, E21.209, E21.21, 257/E21.294, E21.545, E21.679, E21.682, 257/E27.103, E20.129; 438/424, 591, 593
See application file for complete search history.

(56) References Cited

U.S. PATENT DOCUMENTS

2002/0158273 A1 * 10/2002 Satoh et al. .................. 257/211
2005/0215074 A1 9/2005 Shone

* cited by examiner

*Primary Examiner* — Evan Pert
*Assistant Examiner* — Selim Ahmed

(57) ABSTRACT

An embodiment of the present invention is directed to a method of forming a memory cell. The method includes etching a trench in a substrate and filling the trench with an oxide to form a shallow trench isolation (STI) region. A portion of an active region of the substrate that comes in contact with the STI region forms a bitline-STI edge. The method further includes forming a gate structure over the active region of the substrate and over the STI region. The gate structure has a first width substantially over the center of the active region of the substrate and a second width substantially over the bitline-STI edge, and the second width is greater than the first width.

5 Claims, 6 Drawing Sheets

FLASH MEMORY CELL WITH A FLAIR GATE

BACKGROUND

Due to the inevitable requirements to further shrink design rules while still maintaining sufficient oxide thickness for isolation, there is a trend in the semiconductor field away from Local Oxidation of Silicon (LOCOS) and toward Shallow Trench Isolation (STI) because STI has superior scalability. However, STI is not without its disadvantages.

FIG. 1 illustrates a conventional flash memory structure 100 using STI. Flash memory structure 100 has a plurality of bitlines 110 and a wordlines 120. A memory cell is formed by the intersection of a bitline and a wordline. In between the bitlines 110 are the STI trenches. Due to damage caused at the bitline-STI edge during manufacturing, current variations are seen at the bitline-STI edge. In other words, the current through the a bitline 110 has both a center current component 130 and an edge current component 140. The edge current component 140 is much slower than the center current component 130. The presence of the slower edge currents 140 causes increased programming time, thus limiting the programming speed of the memory cell. Consequently, conventional memory cells using STI technology achieve less than optimal programming speeds.

SUMMARY

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

An embodiment of the present invention is directed to a method of forming a memory cell. The method includes etching a trench in a substrate and filling the trench with an oxide to form a shallow trench isolation (STI) region. A portion of an active region of the substrate that comes in contact with the STI region forms a bitline-STI edge. The method further includes forming a gate structure over the active region of the substrate and over the STI region. The gate structure has a first width substantially over the center of the active region of the substrate and a second width substantially over the bitline-STI edge, and the second width is greater than the first width.

Thus, embodiments of the present invention pertain to devices and methods that provide improved memory cell performance, and in particular, a reduction in bitline-STI edge current. By reducing bitline-STI edge current, embodiments provide for memory cells that have improved programming speed.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments reduce the effect of bitline-STI edge currents in memory cells by using a "flair" gate structure. In other words, for each memory cell, the wordline width at the center of the cell represents the wordline width of the cell. At the bitline-STI edges of the memory cell, the wordline flares wider. The wider wordline width at the edges forces the majority of the current to go through the central portion of the bitline, thus effectively minimizing the effect of the bitline-STI edge.

Figure 1:
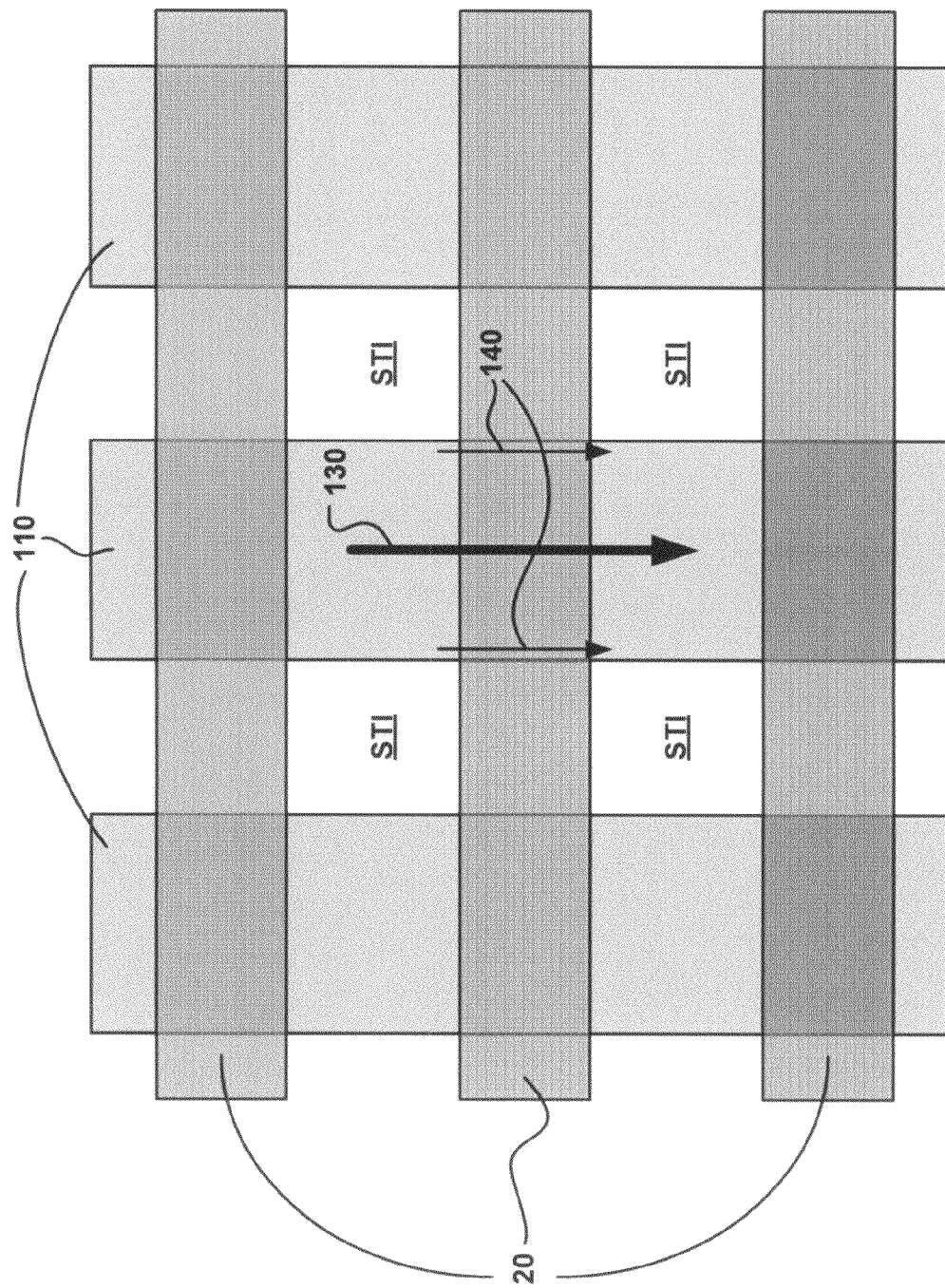
FIG. 1 illustrates a conventional flash memory structure using STI.
Figure 2A:
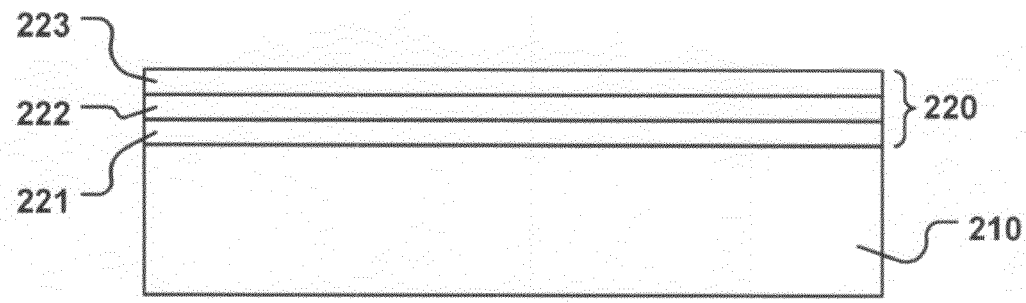
FIG. 2A illustrates a cross-sectional view of an exemplary semiconductor device illustrating a substrate and a preliminary gate structure, in accordance with various embodiments of the present invention.

FIG. 2A illustrates a cross-sectional view of an exemplary semiconductor device, in accordance with various embodiments of the present invention. In one embodiment, the semiconductor device is a NAND memory cell. The device includes a substrate 210 and a gate structure 220 formed over the substrate 210. It should be appreciated that gate structure 220 may be achieved in many ways. For example, gate structure 220 may be a charge trapping structure or a floating gate structure. Gate structure 220 may include an oxygen layer 221, a nitrogen layer 222, and a second oxygen layer 223.

Figure 2B:
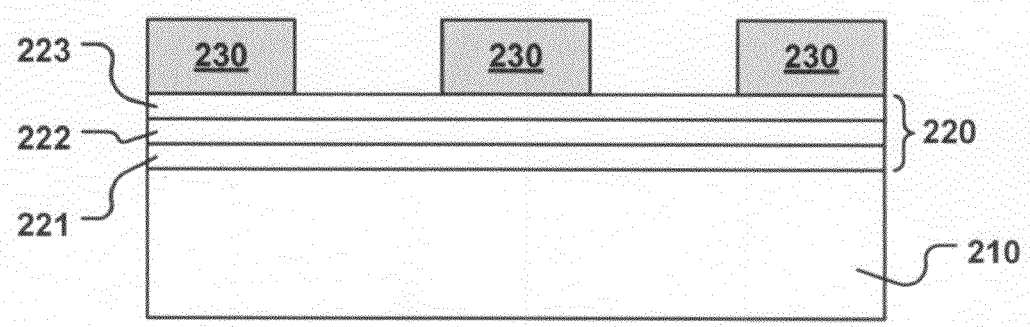
FIG. 2B illustrates a cross-sectional view of an exemplary semiconductor device illustrating a substrate, a preliminary gate structure, and a mask pattern, in accordance with various embodiments of the present invention.

As shown in FIG. 2B, mask pattern 230 is formed over the gate structure 220. Mask pattern 230 can be one of a number of different types of masks, including optical photoresist responsive to visible engineer UV light, deep UV resistant, and the like. Alternatively, mask pattern 230 can be inorganic resist layer, and x-ray resist layer, and the like. In one embodiment, mask pattern 230 is a hard mask structure. In one embodiment, mask pattern 230 is silicon dioxide or silicon nitride.

Mask pattern 230 (if photosensitive resist) is exposed to radiation of the appropriate wavelength and developed to form a mask pattern overlying substrate 210, as illustrated in FIG. 2B. Alternatively, mask 230 can be deposited as a hard mask using process is well-known in the art. Mask pattern 230 allows for exposing a selected region of the gate structure 220. The selected region will form an STI trench after subsequent processing steps.

Figure 2C:
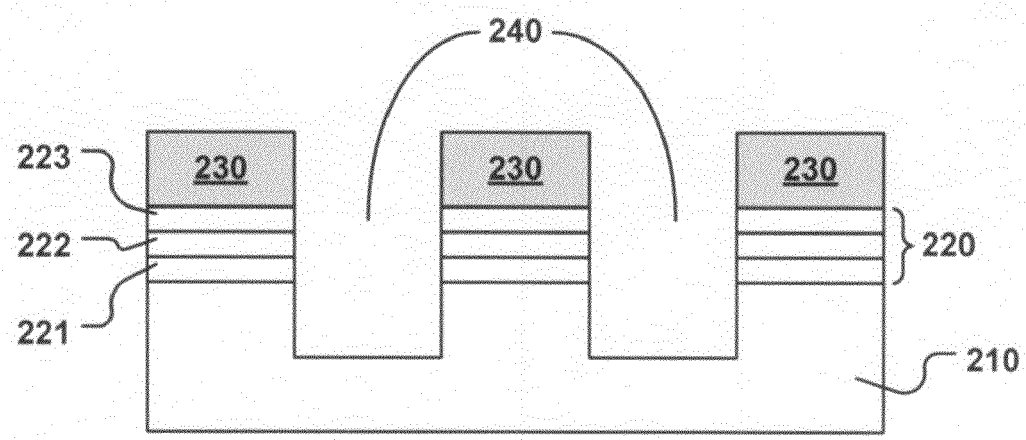
FIG. 2C illustrates a cross-sectional view of an exemplary semiconductor device illustrating an STI trench, in accordance with various embodiments of the present invention.

As shown in FIG. 2C, after the mask pattern 230 is formed, the etching process removes a portion of material from gate structure 220 and substrate 210 to form trenches 240 in the selected regions. The etching presses removes material from the gate structure 220 and the substrate 210 that is not protected by the mask pattern 230.

Figure 2D:
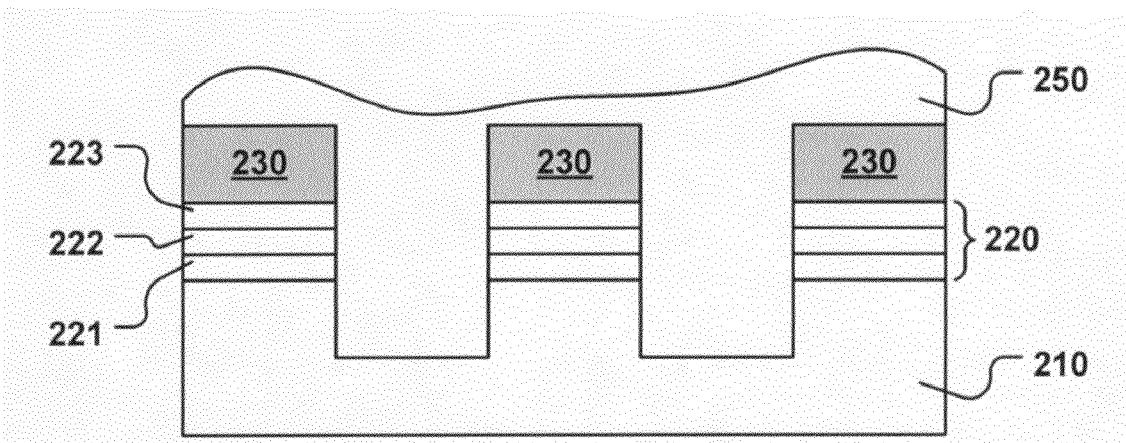
FIG. 2D illustrates a cross-sectional view of an exemplary semiconductor device illustrating STI trenches filled with an oxide, in accordance with various embodiments of the present invention.

FIG. 2D illustrates a cross-sectional view of an exemplary semiconductor device after filling the trenches 240. In one embodiment, trenches 240 are filled with an oxide 250 that is appropriate for STI technology.

Figure 2E:
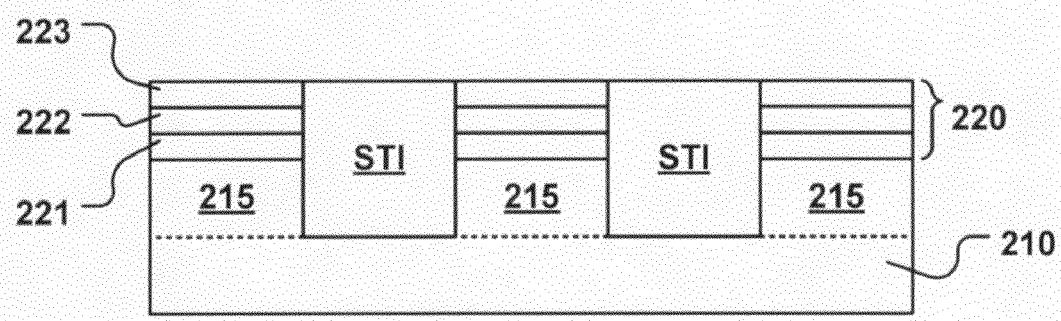
FIG. 2E illustrates a cross-sectional view of an exemplary semiconductor device after polishing an STI oxide, in accordance with various embodiments of the present invention.
Figure 2F:
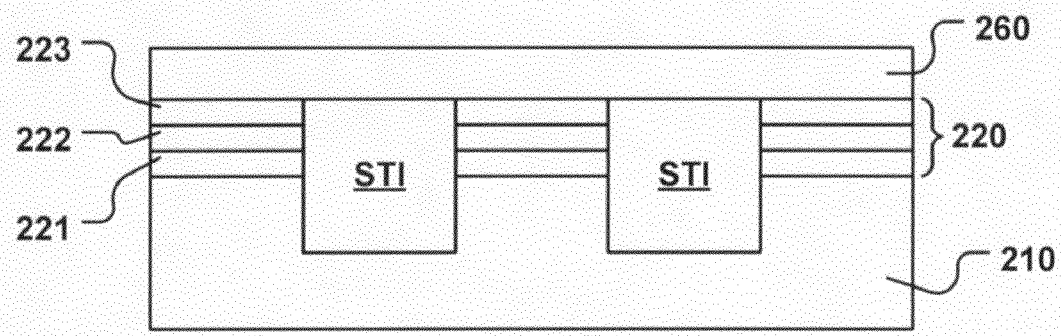
FIG. 2F illustrates a cross-sectional view of an exemplary semiconductor device illustrating the formation of a polysilicon layer, in accordance with various embodiments of the present invention.

FIG. 2E illustrates a cross-section of an exemplary semiconductor device after forming STI regions and after a polishing step has been done to remove excess material (i.e., mask pattern 230 and oxide material). Polishing can be done in many ways that are known in the art, and one embodiment, a chemical mechanical planarization (CMP) is done to smooth the surface of the semiconductor device so the surface is level with the gate structure 220. The CMP is also done to remove the mask pattern 230 so subsequent layers can be formed over the gate structure 220. Once the STI regions have been formed, the portion of the substrate 210 adjacent to the STI regions consequently becomes an active region 215 of the substrate 210. As shown in FIG. 2F, a polysilicon layer 260 may then be formed over the gate structure 220 and over the STI regions.

Figure 2G:
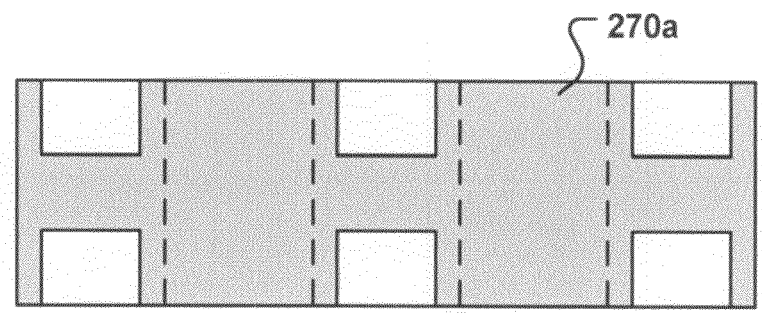
FIG. 2G is an illustration of an example mask for forming a flair gate structure, in accordance with various embodiments of the present invention.
Figure 2H:
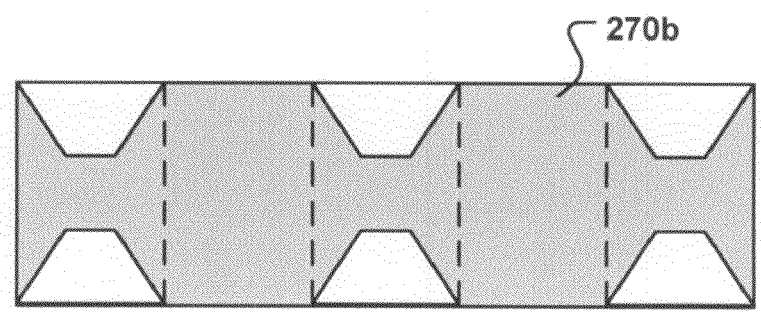
FIG. 2H is an illustration of another example mask for forming a flair gate structure, in accordance with various embodiments of the present invention.
Figure 2I:
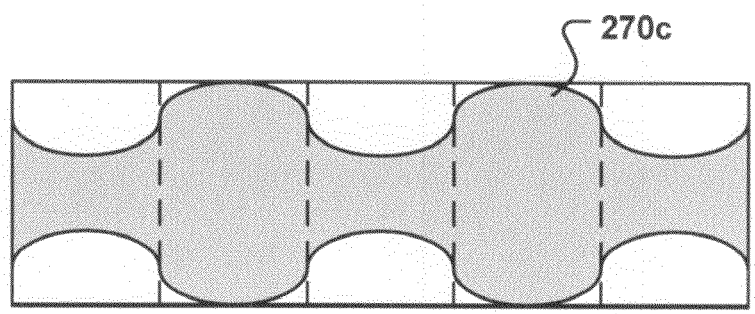
FIG. 2I is an illustration of another example mask for forming a flair gate structure, in accordance with various embodiments of the present invention.

FIGS. 2G-2I illustrate a top views of an exemplary semiconductor device after forming STI regions and after a polishing step. FIGS. 2G-2I are provided for illustrative purposes to show a memory cell and portions of two adjacent memory cells, and it should be appreciated that the actual device may extend beyond what is shown (i.e., longer bitlines and longer wordlines). As shown in FIGS. 2G-2I, a second mask pattern 270 is placed over the device. The shape of mask pattern 270 is such that its width over a bitline-STI edge is greater than its width over an active region 215 of the substrate 210. For example, mask pattern 270a of FIG. 2G employs an "H" pattern, while mask pattern 270b of FIG. 2H employs more of sawtooth pattern, and further still mask pattern 270c of FIG. 2I employs a somewhat sinusoidal pattern. It should be appreciated that other shapes of mask patterns may be used instead of the patterns depicted in FIGS. 2G-2I, so long that the width over the bitline-STI edge is greater than the width over the center of the active region 215 of the substrate 210.

Once the mask pattern 270 is in place, the portions of the poly layer 260 and the gate structure 220 not covered by the mask 270 are etched. The mask pattern 270 is subsequently removed, revealing a gate structure similar in shape to that of the mask pattern 270.

Figure 3:
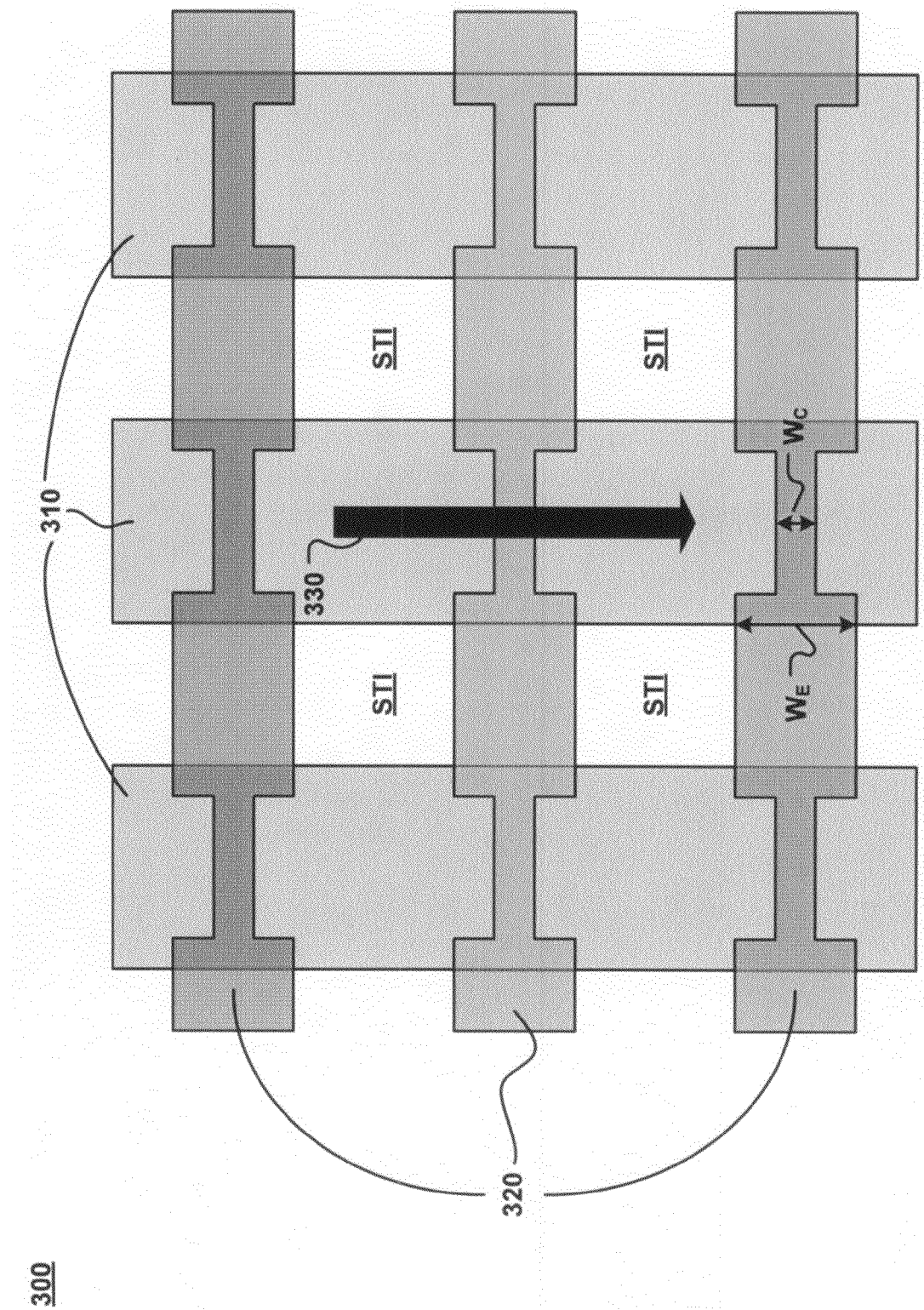
FIG. 3 illustrates an exemplary memory array with flair gates, in accordance with various embodiments of the present invention.

FIG. 3 illustrates a portion of a memory array 300, in accordance with various embodiments of the present invention. In one embodiment, memory array 300 is a flash memory array. In FIG. 3, for simplicity of discussion and illustration, a limited number of wordlines 320 and bitlines 310 are illustrated. However, it is understood that a memory array may actually utilize a different number of wordlines and bitlines. That is, memory array 300 will in actuality extend further to the left and right and also horizontally and vertically (left, right, horizontal, and vertical being relative directions). Wordlines may be referred to as rows and bitlines may be referred to as columns; however, it is understood that those are relative terms. It is also understood that only certain elements of a memory array are illustrated; that is, a memory array may actually include elements other than those shown.

The bitlines 310 are substantially parallel to each other, and wordlines 320 are substantially orthogonal to the bitlines 310. STI regions run between the bitlines 310. The wordlines 320 and the bitlines 310 overlap (but are not connected) at a number of nodes. Corresponding to each of these nodes is a memory cell. The memory cells may be a single bit memory cell or a mirror bit memory cell. Of particular interest is the shape of the wordlines 320. Wordlines 320 are formed such that their width over a bitline-STI edge ($W_E$) is greater than their width over the center of a bitline ($W_C$). The presence of the wider wordline width at the edge forces the majority of the current 330 to go through the central portion of the wordline, thereby dramatically reducing currents along the bitline-STI edges.

Figure 4:
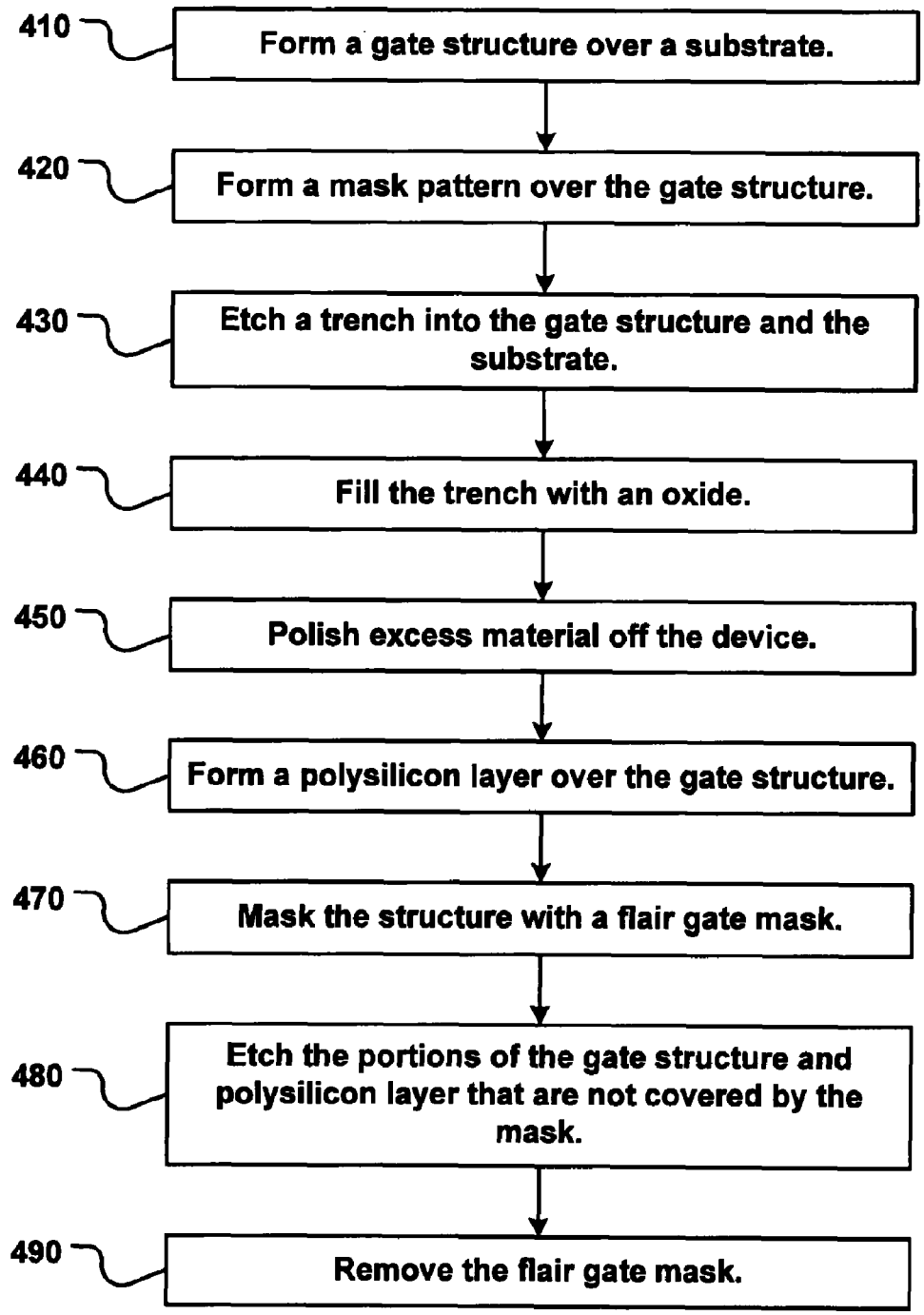
FIG. 4 is a flowchart of a process for forming a memory cell, in accordance with various embodiments of the present invention.

FIG. 4 is a flowchart of a process 400 for forming a memory cell, in accordance with various embodiments of the present invention. In one embodiment, the memory cell is a NAND memory cell. Furthermore, although specific steps are disclosed in process 400, such steps are exemplary. That is, the present invention is well-suited to performing various other steps or variations of the steps recited in process 400. For simplicity of discussion illustration, process 400 is described for single memory cell, although in actuality multiple memory cells may be formed.

Is appreciated other processes and steps associated with the fabrication of a memory cell may be performed along with process 400 illustrated in FIG. 4; that is, there may be a number of process steps before and after the steps shown in described by FIG. 4. Importantly, embodiments can be implemented in conjunction with these other (conventional) processes and steps without significantly perturbing them. Generally speaking, process steps associated with the various embodiments of the present invention can be added to conventional process without significantly affecting the peripheral processes and steps.

At block 410 a gate structure is formed over a substrate. In one embodiment, the gate structure may comprise an ONO charge trapping structure. In another embodiment, the gate structure may comprise a floating gate structure.

At block 420, a mask pattern is formed over the gate structure. The mask pattern can be one of a number of different types of masks, including optical photoresist responsive to visible engineer UV light, deep UV resistant, and the like. Alternatively, the mask pattern can be inorganic resist layer, and x-ray resist layer, and the like. In one embodiment, the mask pattern is a hard mask structure. In one embodiment, the mask pattern is silicon dioxide or silicon nitride.

At block 430, a trench is etched into the substrate and the gate structure. For example, the mask pattern (if photosensitive resist) is exposed to radiation of the appropriate wavelength and developed to form a mask pattern overlying the substrate, as illustrated in FIG. 2B. Alternatively, the mask can be deposited as a hard mask using processes well-known in the art. The mask pattern allows for exposing a selected region of the gate structure. The selected region will form an STI trench after subsequent processing steps.

At block 440, the trench is filled with an oxide to form an STI region. At block 450, the device is polished in order to remove excess material such as the mask pattern and any residual oxide material. Polishing can be done in many ways that are known in the art, and one embodiment, a chemical mechanical planarization (CMP) is done to smooth the surface of the semiconductor device so surfaces level with the gate structure. The CMP is also done to remove the mask pattern so subsequent layers can be formed over the gate structure. Once the STI regions have been formed, the portion of the substrate adjacent to the STI regions effectively becomes an active region of the substrate (e.g., active region 215 of FIG. 2E). At block 460, a polysilicon layer 260 is formed over the gate structure and over the STI region.

At block 470, the memory cell is masked with a flair gate mask. The shape of the flair gate mask is such that its width over a bitline-STI edge is greater than its width over an active region of the substrate. It should be appreciated that a variety of flair gate mask shapes may be created that conform to these requirements.

At block 480, the portions of the polysilicon layer and the gate structure that are not covered by the flair gate mask are etched. At block 490, the mask is then removed, revealing a flair gate structure similar in shape to that of the flair gate mask pattern (e.g., gate structure of memory cells depicted in FIG. 3).

In summary, embodiments of the present invention pertain to devices and methods that provide improved memory cell performance, and in particular, a reduction in bitline-STI edge current. By reducing bitline-STI edge current, embodiments provide for memory cells that have improved programming speed.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of forming a memory cell, the method comprising:
    forming a charge trapping layer over a substrate wherein the charge trapping layer comprises an oxide-nitride-oxide layer or an oxide-Silicon Rich Nitride-oxide layer;
    etching a trench in the charge trapping layer and the substrate;
    filling the trench with an oxide to form a shallow trench isolation (STI) region, wherein a portion of an active region of the substrate that comes in contact with the STI region forms a bitline-STI edge;
    masking the charge trapping layer with a mask, wherein the mask has a first width substantially over the center of the active region of the substrate and a second width that is centered above the STI region and extends substantially over the bitline-STI edge, wherein the second width is greater than the first width and wherein portions of adjacent gate structures of the second width extend across separate portions of the same bitline;
    etching the charge trapping layer; and
    removing the mask.

2. The method as recited in claim 1 further comprising:
    masking the charge trapping layer before said etching.

3. The method as recited in claim 1 wherein the memory cell is a NAND memory cell.

4. The method as recited in claim 1 further comprising:
    forming a polysilicon layer over the charge trapping layer and the STI region.

5. The method as recited in claim 1 further comprising:
    polishing the memory cell with a CMP process.

* * * * *